United States Patent [19]

Dendinger

[11] Patent Number: 5,428,307
[45] Date of Patent: Jun. 27, 1995

[54] CLOSED-LOOP PEAK DETECTOR TOPOLOGY

[75] Inventor: Stan Dendinger, Irvine, Calif.

[73] Assignee: Silicon Systems, Inc., Tustin, Calif.

[21] Appl. No.: 140,757

[22] Filed: Oct. 20, 1993

[51] Int. Cl.$^6$ .................... G01R 19/04; H03K 5/24
[52] U.S. Cl. ........................... 327/62; 327/60; 327/73; 327/78; 327/91; 327/95
[58] Field of Search ............... 307/351, 354, 358, 359; 328/150, 151; 327/58, 59, 60, 62, 72, 73, 78, 91, 94, 95

[56] References Cited

U.S. PATENT DOCUMENTS

| | | | |
|---|---|---|---|
| 4,086,651 | 4/1978 | Muir et al. | 307/351 |
| 4,400,633 | 8/1983 | Mouri | 307/351 |
| 4,585,956 | 4/1986 | Lie | 307/359 |
| 4,866,301 | 9/1989 | Smith | 307/351 |
| 4,926,068 | 5/1990 | Fujita | 307/359 |
| 5,120,995 | 6/1992 | Abdi | 307/351 |
| 5,287,063 | 2/1994 | Izawa | 307/351 |
| 5,302,863 | 4/1994 | Walley et al. | 307/351 |
| 5,315,168 | 5/1994 | Norton, Jr. | 307/351 |

FOREIGN PATENT DOCUMENTS

| | | | |
|---|---|---|---|
| 52-20067 | 2/1977 | Japan | 307/351 |
| 60-163229 | 8/1985 | Japan | 307/351 |
| 2026803 | 2/1980 | United Kingdom | 307/351 |

OTHER PUBLICATIONS

IBM Technical Disclosure Bulletin, Cunningham, "High Speed Peak Detector", Feb. 79, pp. 3544–3545.

*Primary Examiner*—Timothy P. Callahan
*Assistant Examiner*—Terry D. Cunningham
*Attorney, Agent, or Firm*—Hecker & Harriman

[57] ABSTRACT

The present invention is a closed loop peak detection circuit comprising switching means, comparing means, control means, two current sources, and a holding capacitor. The switching means selectively provides one of a plurality of input signals to the comparing means. The control means is coupled to the comparing means. The control means receives first and second control signals for selecting one of three modes: reset, peak detect, and hold. First and second current sources are coupled to the control means. A capacitor is coupled to the first and second current sources for generating an output signal. The output signal is feedback coupled to the comparing means. The comparing means determines when one of the plurality of input signals exceeds the output signal. The control means enables and disables the current sources in response to the comparing means and to the first and second control signals. In reset mode, the second current source discharges the capacitor until the output voltage is equal to a baseline voltage $V_{REF}$. In peak detect mode, the first current source charges the capacitor when the instantaneous value of the output signal is less than the input signal. The peak detector uses the input signal to pump up the output voltage to the most positive value of input signal. In hold mode, the current sources are disabled. The capacitor maintains a nearly constant amount of charge. Thus, the output voltage is equal to the peak voltage of the input signal stored on the capacitor.

13 Claims, 7 Drawing Sheets

FIG. 6
_PRIOR ART_

FIG. 7
_PRIOR ART_

CLOSED-LOOP PEAK DETECTOR TOPOLOGY

BACKGROUND OF THE INVENTION

1. Field of the Invention

The present invention is related to the field of peak detection.

2. Background Art

Peak detectors are devices for determining the maximum (peak) amplitude of an input signal. Such circuits typically comprise a holding capacitor for storing charge from the input signal and control circuitry to govern application of the input signal to the holding capacitor. Thus, the control circuit controls charging and discharging of the holding capacitor. In conjunction with the control circuit, the holding capacitor is charged up to store a voltage that increases toward the peak value of the input signal.

Figure 1:
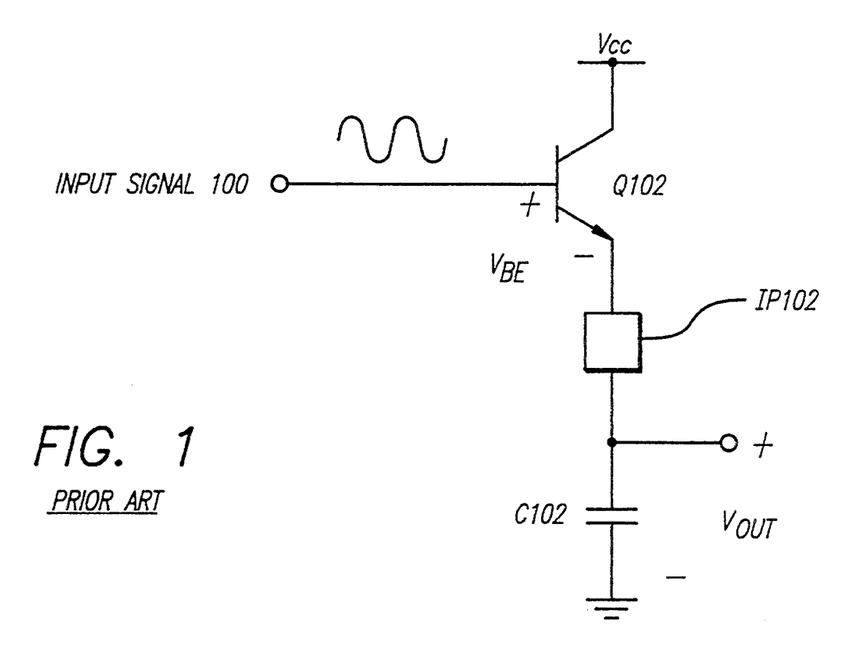
FIG. 1 is a diagram illustrating a prior art (open-loop) peak detector.

FIG. 1 is a diagram illustrating a prior art peak detector comprising NPN transistor Q102 anti holding capacitor C102. Supply voltage $V_{CC}$ is provided to the collector of transistor Q102. Input signal 100 is coupled to the base of transistor Q102. The emitter of transistor Q102 is coupled to an external holding (memory) capacitor C102 through input pad IP102. The second terminal of capacitor C102 is coupled to ground. The output voltage $V_{OUT}$ is taken across capacitor C102 with respect to ground. The circuit illustrated in FIG. 1 is an open-loop peak detector.

In FIG. 1, when input signal 100 becomes more positive than the sum of output voltage $V_{OUT}$ across capacitor C102 and the base-emitter voltage $V_{BE}$ of transistor Q102, the emitter of transistor Q102 is pulled up. Transistor Q102 sources current to holding capacitor C102. This current charges up capacitor C102 until the input signal 100 decreases below the instantaneous value of output voltage $V_{OUT}$ plus the base-emitter voltage $V_{BE}$ of transistor Q102. When the input signal 100 provided to the base of transistor Q102 drops below this level, the emitter-base junction of transistor Q102 is reverse biased. In this state, current is not conducted through transistor Q102 to capacitance C102. Thus, capacitor C102 holds the most positive value of the input signal 100 less the $V_{BE}$ drop of transistor Q102 that capacitor C102 charged to.

A disadvantage of this prior art circuit is that the output voltage cannot reach the peak amplitude of the input signal. The output voltage $V_{OUT}$ stored on capacitor C102 has a maximum voltage level of one base-emitter voltage drop less than the peak input signal 100. Also, the base-emitter voltage drop of transistor Q102 makes the prior art peak detector insensitive to peaks of the input signal 100 less than approximately 0.6 volts above the instantaneous voltage level of the output signal $V_{OUT}$.

Another disadvantage of this prior art circuit is inaccuracy in the output voltage due to variations in base-emitter voltage of the transistor. The variations in base-emitter voltage of transistor Q102 are caused by temperature and current variations. Thus, the offset of the peak voltage across capacitor C102, due to the base-emitter voltage of transistor Q102, varies over temperature and device beta.

Figure 2:
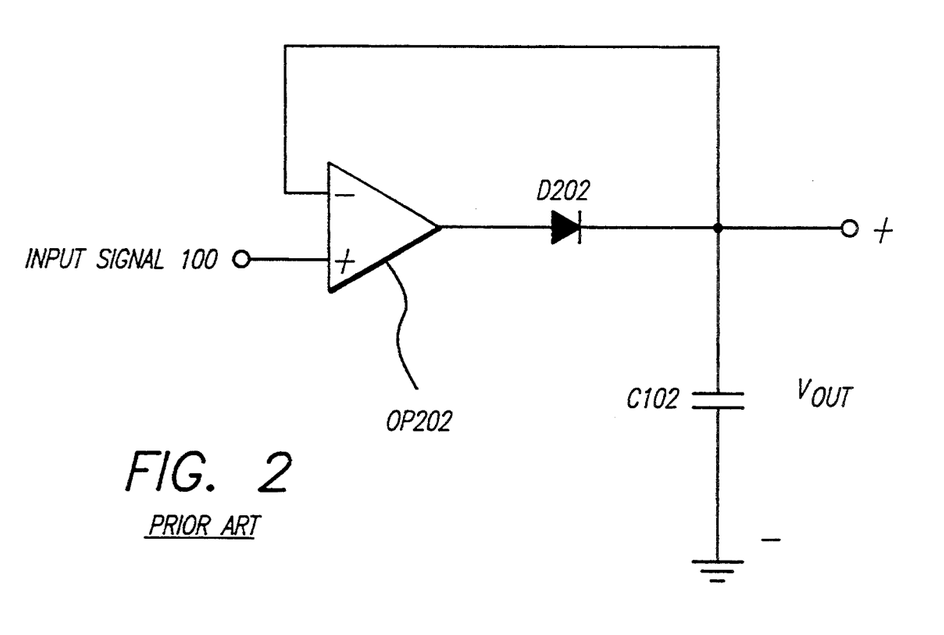
FIG. 2 is a diagram illustrating another prior art (closed-loop) peak detector.

FIG. 2 is a diagram illustrating another prior art peak detector. This closed-loop peak detector comprises an operational amplifier OP202, diode D202 and holding capacitor C102. Input signal 100 is coupled to the non-inverting input of operational amplifier OP202. The output of operational amplifier OP202 is coupled to a first terminal of diode D202. The second terminal of diode D202 is coupled to a first terminal of capacitor C102 and to the inverting input of operational amplifier OP202. The second terminal of capacitor C102 is coupled to ground. The output voltage $V_{OUT}$ is provided across capacitor C102.

Input signal 100 drives operational amplifier OP202. In turn, operational amplifier OP202 controls holding (memory) capacitor C102 through diode D202. The close-loop feedback of output voltage $V_{OUT}$ to operational amplifier OP202 causes operational amplifier OP202 to provide a voltage at its output that is one diode drop above output voltage $V_{OUT}$. The operational amplifier OP202 acts as a unity gain buffer that can only source current due to diode D202. When input signal 100 drops below output voltage $V_{OUT}$, diode D202 is reverse-biased so that no charging current is provided to capacitor C102.

When input signal 100 exceeds the output voltage $V_{OUT}$, operational amplifier OP202 generates a voltage to forward bias diode D202. With diode D202 forward biased, operational amplifier OP202 sources a current to charge capacitor C102. The charging current increases the output voltage $V_{OUT}$ across capacitor C102 until it matches the input signal 100. The closed-loop of this prior art circuit interrupts the charging current through diode D202 when the instantaneous output voltage $V_{OUT}$ equals the input signal 100. In this prior art circuit, the effect of the offset voltage of diode D202 is reduced. However, this prior art peak detector has several disadvantages.

A disadvantage of the prior art is due to the finite slew-rate of the operational amplifier in the peak detector. The voltage output of operational amplifier OP202 goes into negative saturation when the input signal is lower than the output voltage $V_{OUT}$. The finite slew-rate prevents the voltage generated by operational amplifier OP202 from accurately following higher frequency input signals 100 when input signal 100 exceeds the output voltage $V_{OUT}$.

Another disadvantage of the prior art is "droop" of the output voltage due to bias and leakage currents. The input bias current of operational amplifier OP202 discharges capacitor C102 producing a decrease in output voltage $V_{OUT}$. Similarly, the leakage current of diode D202 also produces droop in the output voltage $V_{OUT}$.

Yet another disadvantage of the prior art is poor noise rejection due to the diode. Transients in input signal 100 that exceed the instantaneous value of output voltage $V_{OUT}$ force diode D202 to conduct. This produces an error in the output voltage because the charging current sourced by operational amplifier OP202 increases the output voltage $V_{OUT}$. Thus, the prior art provides poor rejection of noise.

SUMMARY OF THE PRESENT INVENTION

The present invention is related to the field of peak detection. The closed-loop circuit comprises: switching means, comparing means, control means, two current sources, and a holding capacitor. The switching means receives a plurality of input signals. The switching means selectively provides one of the plurality of input signals to the comparing means. Control means is coupled to the comparing means. The control means receives first and second control signals for selecting one of three modes: reset, peak detect, and hold. First and second current sources are coupled to the control means. A capacitor is coupled to the first and second current sources for generating an output signal. The output signal is feedback coupled to the comparing means. The comparing means determines when one of the plurality of input signals exceeds the output signal. The control means enables and disables the first and second current sources in response to the comparing means and to the first and second control signals.

In the reset mode, the second current source draws current from the capacitor until the output voltage of the peak detector is discharged to a baseline voltage $V_{REF}$. The present invention maintains the output voltage at the constant level of $V_{REF}$. In the peak detect mode, the first current source provides current to charge the capacitor until the output voltage is equal to the instantaneous value of the input signal. The present invention uses the input signal to pump up the output voltage to the most positive value of input signal. In the hold mode of the present invention, the first and second current sources are disabled. Current is not sourced to or drained from the capacitor. The capacitor maintains a nearly constant amount of charge. Thus, the output voltage is equal to the peak voltage of the input signal stored on the capacitor.

The comparing means of the present invention comprises a current sink having near-ground voltage compliance. The circuit for sinking a current with near-ground voltage compliance comprises a diode, two transistors, and a Norton amplifier. A diode is coupled to a supply voltage. A first transistor is coupled to ground. A differential pair is coupled between the diode and the first transistor. A second transistor is coupled to the differential pair and the diode for detecting a first current provided by the first transistor. The second transistor provides a second current in response to the first current. The Norton amplification means is coupled to the first transistor for receiving the second current and a reference current. The Norton amplification means controls the first current through the first transistor in response to the second current and the reference current.

DETAILED DESCRIPTION OF THE PRESENT INVENTION

A closed-loop peak detector is described. In the following description, numerous specific details, such as number and nature of external signals, transistors, etc., are described in detail in order to provide a more thorough description of the present invention. It will be apparent, however, to one skilled in the art, that the present invention may be practiced without these specific details. In other instances, well-known features have not been described in detail so as not to unnecessarily obscure the present invention.

CLOSED-LOOP PEAK DETECTOR

Figure 3A:
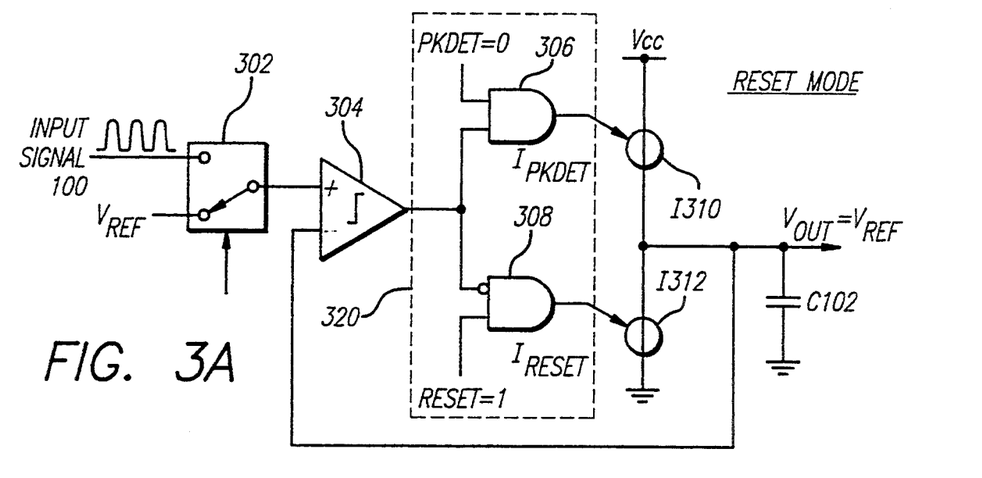
FIGS. 3A–3C are diagrams illustrating the present invention in three modes of operation.

FIG. 3A is a diagram illustrating the preferred embodiment of the present invention comprising switch 302, comparator 304, AND gates 306–308, current sources I310–I312 and holding capacitor C102. Input signal 100 is provided to a first terminal of switch 302. Constant reference voltage $V_{REF}$ is provided to a second input terminal of switch 302. The output of switch 302 is coupled to the non-inverting input of comparator 304. The output of comparator 304 is coupled to the input of AND gate 306 and the inverting input of AND gate 308. A peak detection control signal PKDET is provided to a second input of AND gate 306. A reset control signal RESET is provided to a second input of AND gate 308. The output of AND gate 306 is provided to current source I310. The output of AND gate 308 is provided to current source I312. A first terminal of current source I310 is coupled to voltage supply $V_{CC}$. The second terminal of current source I310 is coupled to a first terminal of current source I312, the inverting input of comparator 304 and a first terminal of capacitor C102. The second terminals of current source I312 and capacitor C102 are coupled to ground. The output voltage $V_{OUT}$ is provided from the node between current sources I310 and I312.

As illustrated in FIG. 3, the PKDET and RESET signals are provided to the peak detector circuit of the present invention. The circuit operates in three modes: reset, peak detect and hold. The peak detector comprises a comparator 304 having a non-inverting input coupled through switch 302 to input signal 100 (which can be a full wave rectified signal) and a reference voltage $V_{REF}$. The output of comparator 304 is provided to AND gates 306 and 308. The upper AND gate has the PKDET signal as an input, and its output controls current source I310 ($I_{PKDET}$). Similarly, the RESET signal is provided to the AND gate 308 that controls current source I312 ($I_{RESET}$). The output voltage $V_{OUT}$ is taken from the node between the two current sources I310 and I312 and is coupled in a feedback loop to the inverting input of comparator 304. Control block 320 comprises AND gates 306 and 308.

FIG. 3A illustrates the present invention in the reset mode. When in the reset mode, the PKDET signal is logic low (0) and the RESET signal is logic high (1). In this mode, switch 302 couples the non-inverting input of comparator 304 to reference voltage $V_{REF}$. Because the peak detection signal PKDET is low, AND gate 306 is disabled. Thus, current source I310 ($I_{PKDET}$) is disabled.

Initially, when capacitor C102 is completely discharged, the output of comparator 304 is high. The high output of comparator 304 is provided to AND gate 308. Because the input of AND gate 308 is negated, its output is low, thereby turning off current source I312. This keeps capacitor C102 in a discharged state, and output voltage $V_{OUT}$ is nearly ground.

When output voltage $V_{OUT}$ is greater than voltage reference $V_{REF}$, comparator 304 outputs a logic low. In response to the low output of comparator 304, AND gate 308 produces a high output. The high output of AND gate 308 enables current source I312 (I$_{RESET}$). Current source I312 draws current from capacitor C102 until the output voltage V$_{OUT}$ of the peak detector is discharged to the baseline voltage V$_{REF}$ applied to switch 302. When this occurs, the output of comparator 304 goes high and current source I312 is disabled. This maintains the output voltage V$_{OUT}$ at the constant baseline level of V$_{REF}$.

Figure 3B:
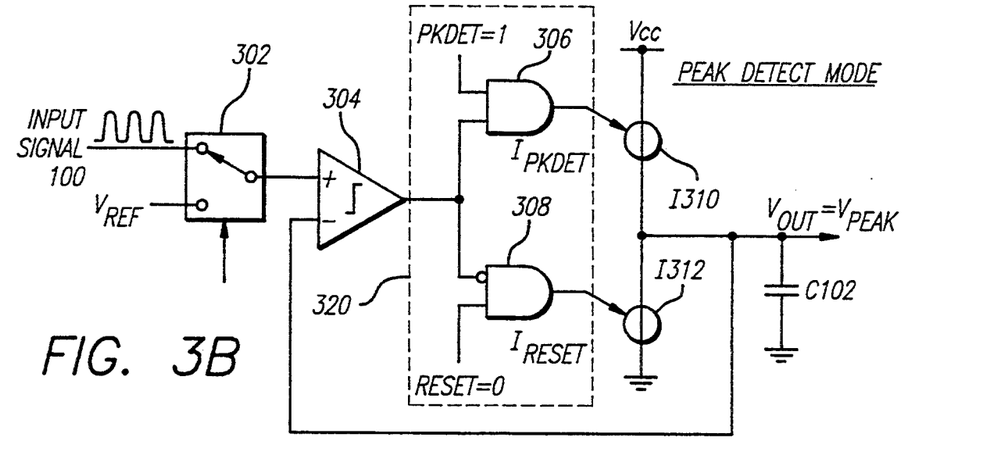

FIG. 3B is a diagram illustrating the peak detection mode of the present invention. When in this mode, the PKDET signal is high and the RESET signal is low. Also, input signal 100 is provided to comparator 304 by switch 302. Thus, AND gate 308 is disabled, thereby disabling current source I312. When input signal 100 is lower than the voltage V$_{OUT}$ stored across capacitor C102, the output of comparator 304 is low. The output of AND gate 306 disables current source I310 that charges capacitor C102.

When input signal 100 exceeds output voltage V$_{OUT}$, the output of comparator 304 goes high. This enables current source I310. Current source I310 charges capacitor C102 until the input signal 100 decreases below the instantaneous level of output voltage V$_{OUT}$. Comparator 304 is a MOSFET input comparator which has no bias current. It compares the input signal 100 with the voltage V$_{OUT}$ using closed loop feedback.

When the output of comparator 304 is high, current source I310 (I$_{PKDET}$) provides current to charge capacitor C102 until the output voltage V$_{OUT}$ is equal to the instantaneous value of the input signal 100. The output voltage V$_{OUT}$ across capacitor C102 is slew-rate limited. Therefore, the present invention requires a series of positive lobes of input signal 100 to pump up voltage V$_{OUT}$ to the most positive value of input signal 100. Thus, in peak detect mode, current source I310 successively charges capacitor C102 when input signal 100 exceeds voltage V$_{OUT}$, thereby increasing voltage V$_{OUT}$.

Figure 3C:
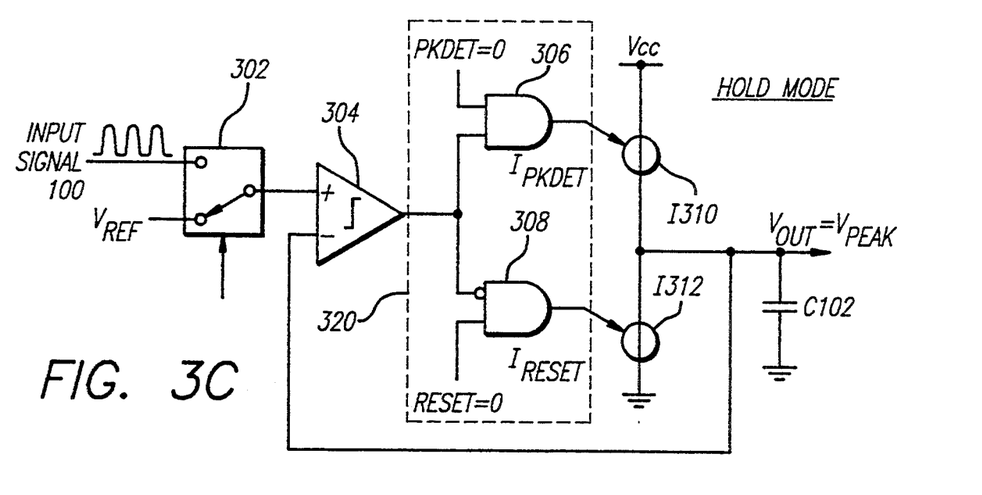

FIG. 3C illustrates the hold mode of the present invention. The PKDET and RESET signals are both low. In this mode, switch 302 couples reference voltage V$_{REF}$ to the non-inverting input of comparator 304. With the PKDET and RESET signals low, current sources I310 and I312 are disabled. Thus, current is not sourced to or drained from capacitor C102, and capacitor C102 maintains a nearly constant amount of charge. Thus, the output voltage V$_{OUT}$ is equal to the peak voltage of the input signal 100 stored in capacitor C102.

It should be apparent to one skilled in the art that a fourth possible mode exists for the circuit: described: PKDET=1 and RESET=1. In this mode, both current sources I310 and I312 are enabled. When switch 302 provides voltage V$_{REF}$ to the non-inverting input of comparator 304, a second reset mode with bi-directional current drive to capacitor C102 is activated. This mode provides a capacitor reset level closer to V$_{REF}$, which is more desirable in some applications.

TIMING DIAGRAM ILLUSTRATING THREE MODES

Figure 4:
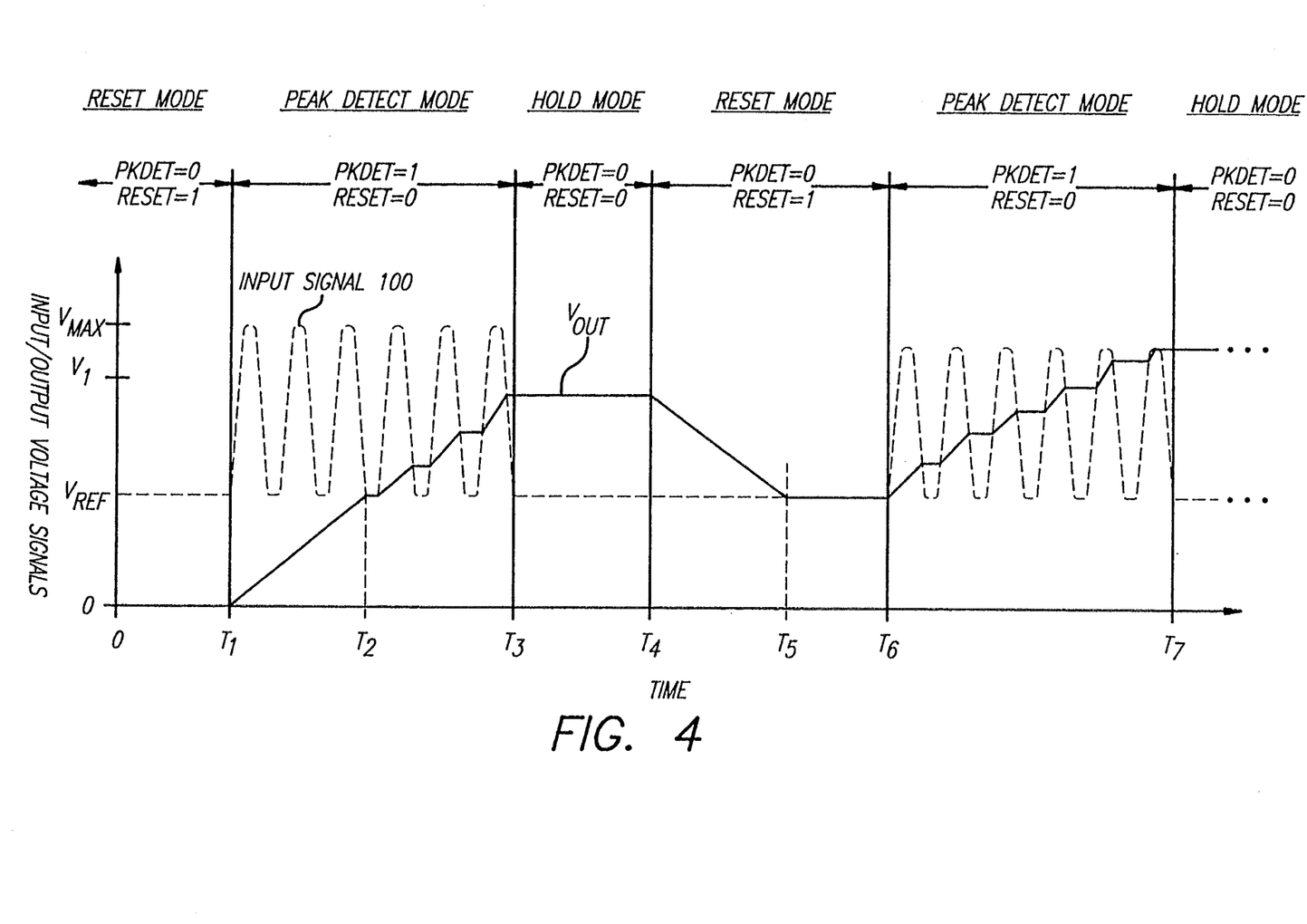
FIG. 4 is a timing diagram illustrating the three modes of the present invention.

FIG. 4 is a timing diagram illustrating the input voltage applied to the non-inverting input of comparator 304 and the corresponding output voltage signal V$_{OUT}$. The input voltage at the non-inverting input of comparator 304 is indicated by a dotted line. During times 0 to T1, the PKDET signal is low and the RESET signal is high. Initially, capacitor C102 is discharged and, thus, the output signal V$_{OUT}$ has a level of 0 volts (indicated by a solid line). Because switch 302 provides voltage V$_{REF}$ to the non-inverting input of comparator 304, the input voltage is equal to V$_{REF}$. As indicated in FIG. 4, current sources I310 and I312 are disabled. The output voltage V$_{OUT}$ is maintained near ground.

Between times T$_1$ and T$_3$, the present invention operates in the peak detect mode. As illustrated in FIG. 3B, the PKDET signal is high and the RESET signal is low. In this mode, the non-inverting input of comparator 304 is coupled to input signal 100. In FIG. 4, the input signal 100 (indicated by a dashed line) is a full-wave-rectified voltage signal. The diagram illustrates six lobes of input signal 100 during this interval.

At time T$_1$, the output voltage V$_{OUT}$ is equal to 0 volts. Between times T$_1$ and T$_2$, the input signal 100 provided to the non-inverting input of comparator 304 is greater than the output signal V$_{OUT}$. Thus, the high output of comparator 304 enables current source I310. Current source I310 charges capacitor C102. In FIG. 4, the output voltage V$_{OUT}$ increases linearly during times T$_1$ and T$_2$ in response to the three lobes of input signal 100.

At time T$_2$, the instantaneous voltage V$_{OUT}$ rises to the lowest level of input signal 100. The output of comparator 304 goes low in response. The low output of comparator 304 disables current source I310. Because current sources I310 and I312 are disabled, the output voltage V$_{OUT}$ of the peak detector is held at a constant level. The output voltage V$_{OUT}$ remains constant until the voltage applied to comparator 304 exceeds the output voltage. Between times T$_2$ and T$_3$, the output voltage V$_{OUT}$ alternately increases by charging capacitor C102 using current source I310.

At time T$_3$, the peak detector switches to the hold mode by setting low the PKDET and RESET signals. Both current sources I310 and I312 (I$_{PKDET}$ and I$_{RESET}$) are disabled. During the hold mode, switch 302 is coupled to constant voltage reference V$_{REF}$ as indicated by the constant level (indicated by a dotted line). In FIG. 4, between times T$_3$ and T$_4$, the output voltage V$_{OUT}$ is held at a constant level V$_1$ (where voltage $0 \leq V_1 \leq V_{MAX}$).

At time T$_4$, the peak detector of the present invention operates in the reset mode. The PKDET signal is low and the RESET signal is high. Setting the PKDET signal to zero disables current source I310. Switch 302 couples the non-inverting input of comparator 304 to the constant reference voltage V$_{REF}$. As indicated in FIG. 4, the output voltage V$_{OUT}$ (solid line) has a value of V$_1$. It is greater than the input voltage of comparator 304 (indicated by a dotted line) equal to V$_{REF}$. Comparator 304 outputs a logic low, thereby enabling current source I312 (I$_{RESET}$) which discharges capacitor C102. The output voltage V$_{OUT}$ decreases linearly from a level of V$_1$ to V$_{REF}$.

At time T$_5$, V$_{OUT}$ reaches the reference voltage V$_{REF}$ coupled to comparator 304. In turn, the output of comparator 304 goes high, thereby disabling current source I312. Between times T$_5$ and T$_6$, the output voltage V$_{OUT}$ has a constant level of V$_{REF}$.

At time T$_6$, the present invention operates in the peak detect mode as illustrated in FIG. 3B. Between times T$_6$ and T$_7$, input signal 100 is coupled to the non-inverting input of comparator 304. In FIG. 4, there are six lobes of the input signal 100 during this interval. When input signal 100 exceeds the output signal V$_{OUT}$, the output of comparator 304 goes high. This enables peak detect current source I310. Current source I310 charges capacitor C102 until the input signal 100 decreases below the instantaneous value of the output voltage $V_{OUT}$. Prior to time $T_7$, current source 310 charges output voltage $V_{OUT}$ to the peak value of the input signal 100 (as illustrated in FIG. 4).

At time $T_7$, the present invention is operated in the hold mode where the PKDET and RESET signals are low. This disables current sources I310 and I312 which prevents the sourcing and sinking of current to holding capacitor C102. Thus, in FIG. 4, the output voltage $V_{OUT}$ remains at its peak value of $V_{MAX}$ after time $T_7$.

The present invention provides closed loop peak detection with low offset voltage, no amplifier slew-rate limitations, and with enhanced noise rejection capability. The peak voltage stored on holding capacitor C102 is not affected by the timing of the peak detect signal applied to AND gate 306. The peak detector also turns itself off. Thus, external logic timing is not critical. A further advantage of the present invention is that the current source drive provides superior noise rejection. Another advantage is that the accuracy of the peak detector is determined by the comparator offset voltage. No matching time constants are required between channels. Yet another advantage of the present invention is that the MOSFET input comparator has minimal input bias current. Thus, little charge is drained off from holding capacitor C102 by the inverting input of comparator 304. Still another advantage of the present invention is that there are no operational amplifier slew-rate/clamp problems. And yet another advantage is that the reset voltage is always equal to or less than $V_{REF}$ voltage.

Figure 5:
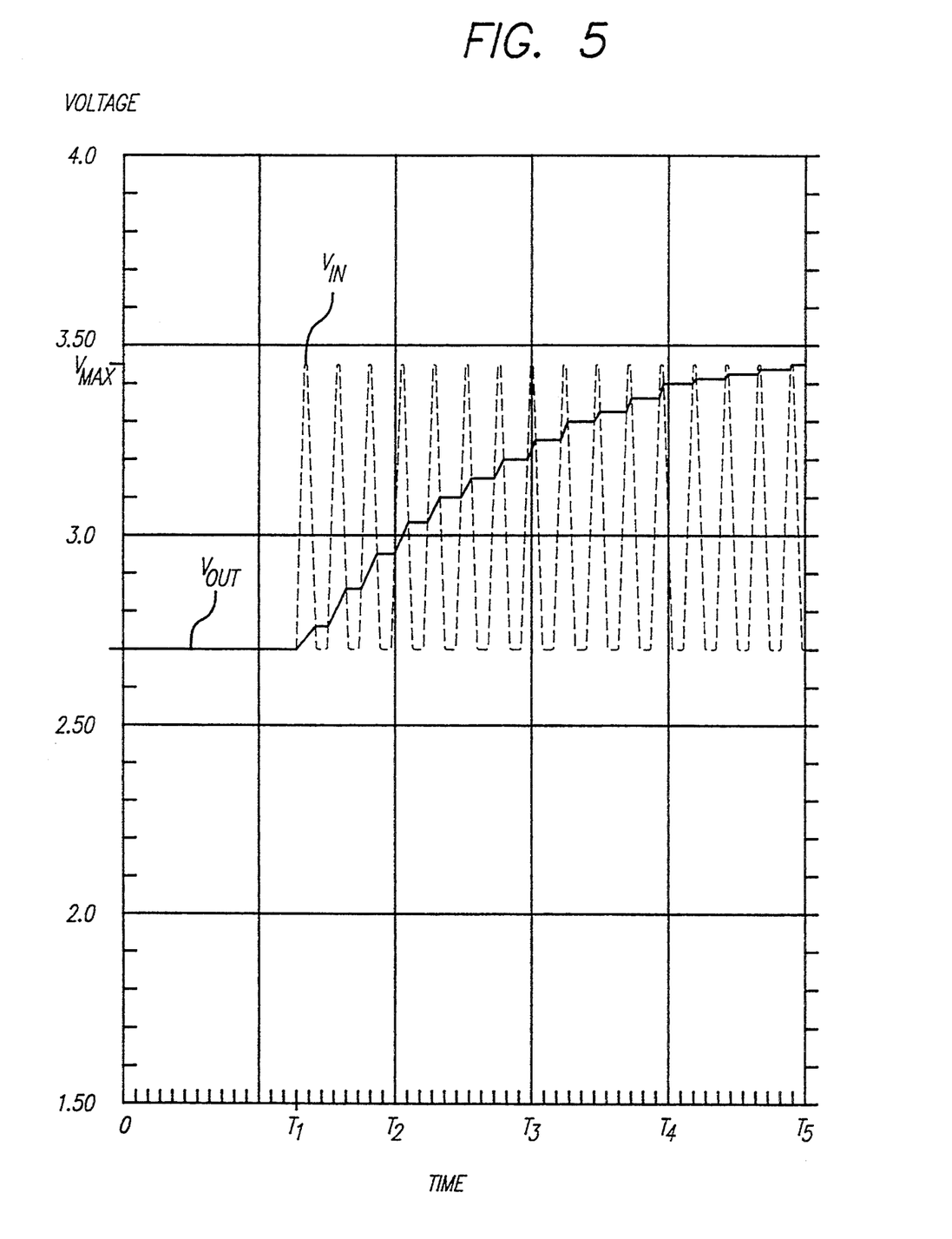
FIG. 5 is a timing diagram illustrating peak detection according to the present invention.

FIG. 5 is a timing diagram illustrating peak detection according to the present invention. Between time zero and time $T_1$, the present invention is operated in the hold mode where the output voltage has a nearly constant level of 2.7 volts indicated by a solid line. At time $T_1$, the input signal 100 is coupled to the non-inverting input of comparator 304. The input signal is indicated by a dotted line. As indicated in FIG. 5, the output voltage $V_{OUT}$ (solid line) linearly increases until the instantaneous value of input signal 100 decreases below the output voltage $V_{OUT}$. Thus, at time $T_5$, the input voltage causes the output voltage $V_{OUT}$ to reach a maximum value of $V_{MAX}$ (the peak voltage of the input signal).

CURRENT SINK WITH NEAR-GROUND COMPLIANCE RANGE

The present invention provides an improved voltage compliance current source for a differential transistor. This circuit is used in the peak detector. As is well-known in the art, integrated circuits (IC) typically require a current source to provide an operating current for a differential pair of transistors.

Figure 6:
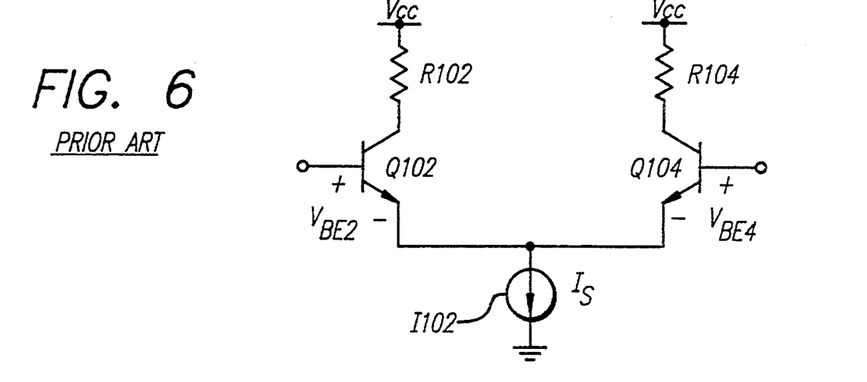
FIG. 6 is a differential amplifier with an idealized current sink (open-loop)

FIG. 6 is a diagram illustrating a prior art current source for a differential pair. The first terminals of resistors R102 and R104 are coupled to supply voltage $V_{CC}$. The second terminals of resistors R102 and R104 are coupled to the collectors of NPN transistors Q102 and Q104, respectively. The bases of transistors Q102 and Q104 receive input signals. The emitters of transistors Q102 and Q104 are coupled together to a first terminal of current source I102. The second terminal of current source I102 is coupled to ground. Current source I102 sinks constant current $I_S$.

Figure 7:
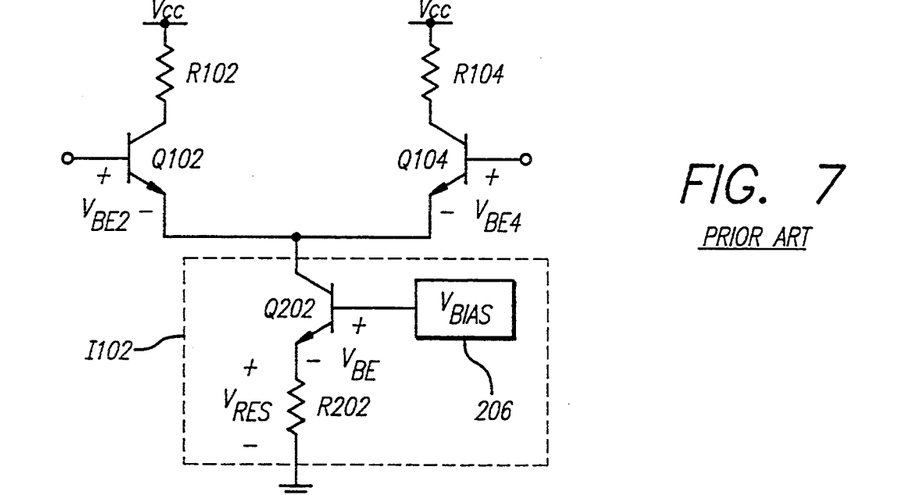
FIG. 7 is a practical prior art realization of the current sink (open-loop)

The current source I102 illustrated in FIG. 6 is implemented in the prior art as illustrated in FIG. 7. Current source I102 comprises NPN transistor Q202, resistor R202 and voltage source 206. The collector of transistor Q202 is coupled to the emitters of transistors Q102 and Q104. The base of transistor Q202 is coupled to voltage source 206 having a value $V_{BIAS}$. Transistor Q202 is emitter-coupled through resistor R202 to ground.

A disadvantage of the prior art scheme illustrated in FIG. 7 is the constraint on the lower range of voltage compliance for current source I102. The voltage drop $V_{RES}$ across resistor R202 is approximately equal to one-half of the base emitter voltage of transistor Q202. For a nominal base-emitter voltage $V_{BE}$ of 0.6 volts, the voltage $V_{RES}$ across resistance R202 is approximately 0.3 volts. Accordingly, the lower limit of voltage compliance at the collector of transistor Q202 is approximately 0.4 volts ($V_{RES}+0.1$ volts). This results in a restriction on the common-mode voltage at the bases of transistors Q102 and Q104. A lower limit for common-mode voltage is desired that is less than the sum of 0.4 V plus the $V_{BE}$ of transistor Q102 or Q104.

Figure 8:
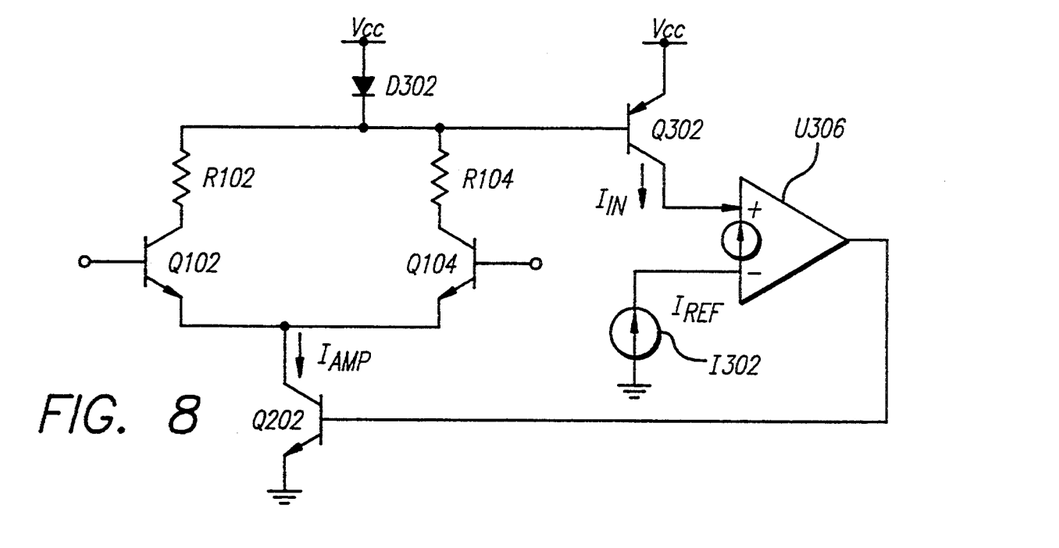
FIG. 8 is a diagram illustrating a current sink with near-ground compliance range according to the present invention.

FIG. 8 illustrates an improved current sink for use with a differential pair according to the present invention. The differential pair is used in the comparator circuit of the present invention. The current sink of the present invention eliminates the emitter resistance voltage drop of the prior art shown in FIG. 7. It achieves a near-ground compliance range.

In FIG. 8, a first terminal of diode 302 is coupled to supply voltage $V_{CC}$. A second terminal diode 302 is coupled to first terminals of resistors R102 and R104, and to the base of PNP transistor Q302. Second terminals of resistors R102 and R104 are coupled to the collector of transistors Q102 and Q104, respectively. Input signals are provided to the bases of transistors Q102 and Q104. The emitters of transistors Q102 and Q104 are coupled together to the collector of transistor Q202. The emitter of transistor Q202 is coupled to ground. The emitter of transistor Q302 is coupled to $V_{CC}$. The collector of transistor Q302 is coupled to the non-inverting input of a Norton amplifier U306. A reference current I302 having a constant value $I_{REF}$ is provided to the inverting input of Norton amplifier U306. The output of Norton amplifier U306 is provided to the base of transistor Q202.

The value of collector current of transistor Q202 is sampled at the top of the differential pair (comprising transistors Q102 and Q104) and mirrored at the collector of transistor Q302. The collector of transistor Q302 is coupled to the non-inverting input of Norton amplifier U306. The inverting input of Norton amplifier U306 is coupled to reference current I302. As is well-known in the art, a Norton amplifier is a current differencing amplifier that takes two currents as inputs, and provides a voltage output corresponding to the difference between the input currents.

When the collector current of transistor Q302 is greater than the reference current I302, Norton amplifier U306 produces a negative error voltage. The error voltage decreases the base voltage of transistor Q202 until the current through transistor Q302 matches current reference I302. When the current through transistor Q302 is less than the reference current I302, the output voltage of Norton amplifier U306 increases. This increases the current sunk by transistor Q202 until it matches I302. Near-ground compliance is achieved by eliminating resistor R202 found in FIG. 7 and high output impedance is realized by using a feedback loop. Thus, the present invention replaces series feedback resistance R202 of the prior art with the feedback loop of Norton amplifier U306, achieving near-ground compliance.

PREFERRED EMBODIMENT OF THE PRESENT INVENTION

Figure 9A:
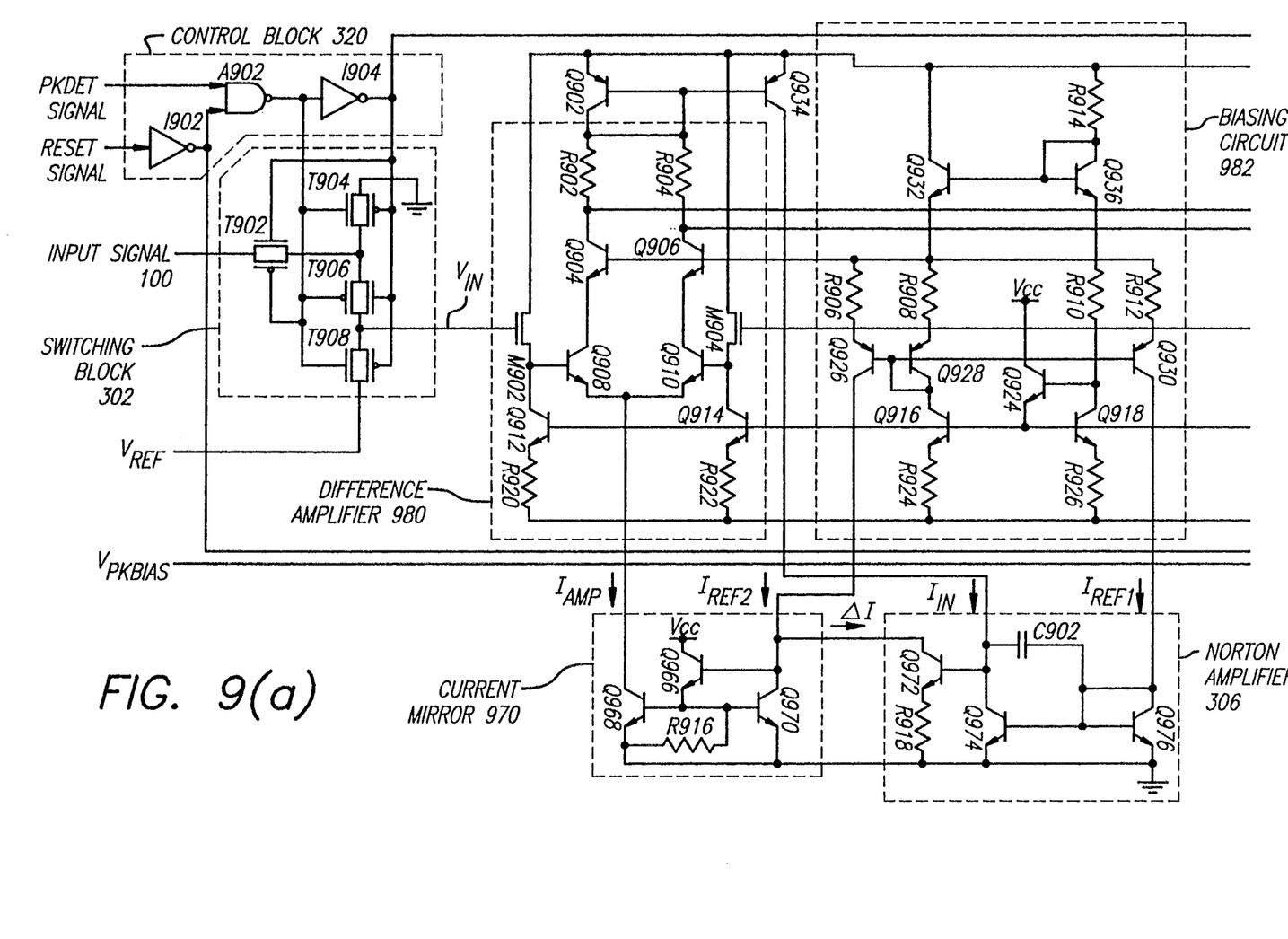
FIG. 9 is an alternate embodiment of the present invention.
Figure 9B:
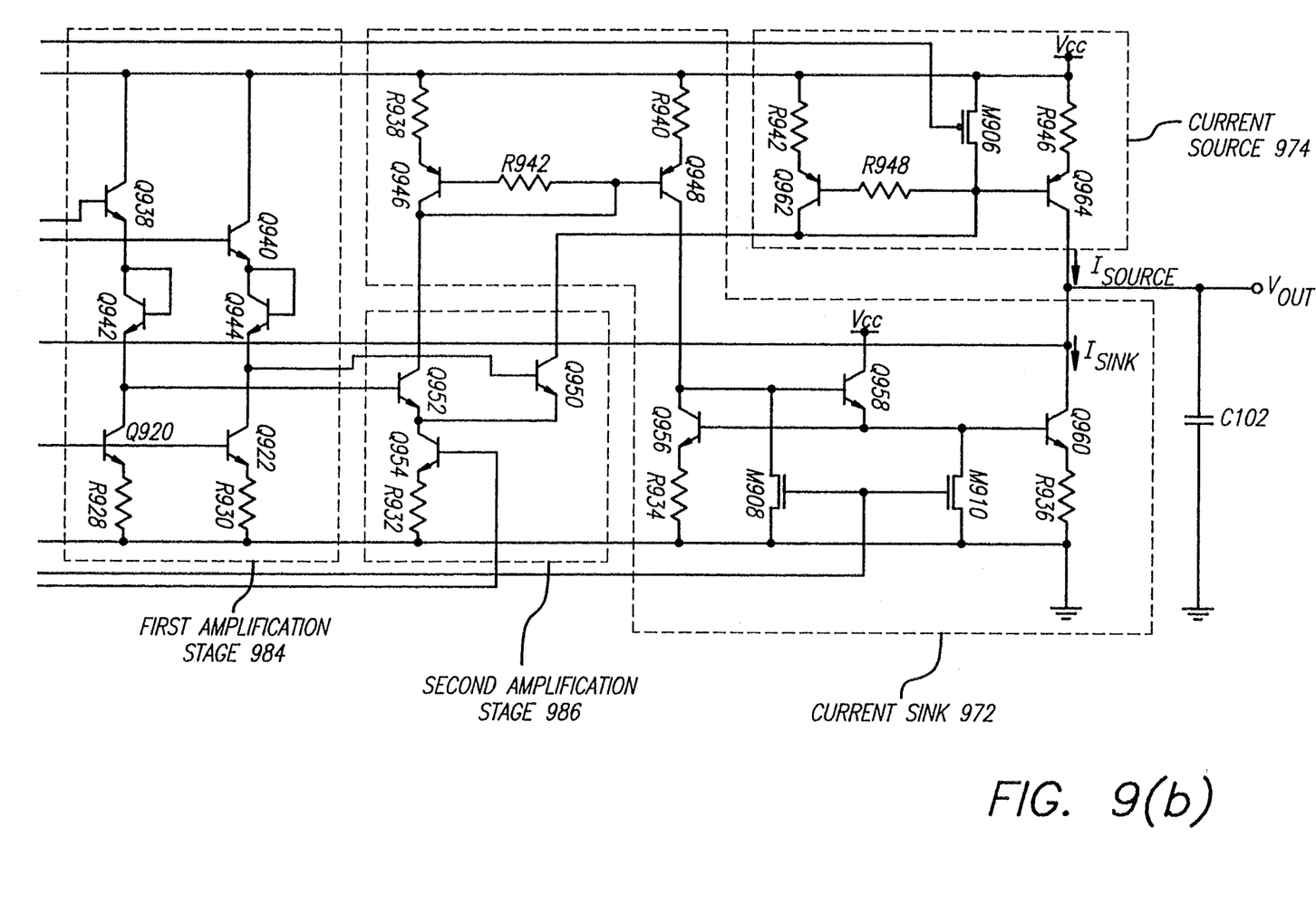

FIG. 9 is a detailed diagram illustrating the preferred embodiment of the present invention. The circuit is a closed-loop peak detector comprising a current sink having near-ground voltage compliance. The device comprises switching block 302, control block 320, difference amplifier 980, level shift stage 984, second amplification stage 986, bias circuit 982, current sources 972 and 974, and capacitor C102. The current sink having near ground voltage compliance comprises Norton amplifier 306 and current mirror 970. Difference amplifier 980 and level shift stage 984 correspond to comparator 304 of FIG. 3A. Similarly, current source 974 and current sink 972 in conjunction with second amplification stage 986 correspond to current sources I310 and I312 of FIG. 3A, respectively.

Control block 320 comprises inverters I902 and I904, NAND gate A902, and FETs M906, M908 and M910. The RESET signal is coupled to the input of inverter I902. The output of inverter I902 is coupled to a first input of NAND gate A902 and to the gates of FETs M908 and M910. Current sink 972 contains FETs M908 and M910. The PKDET signal is provided to the second input of NAND gate A902 of control block 320. The output of NAND gate A902 is coupled to the input of inverter I904 and to switching block 302. Specifically, the output of NAND gate A902 is coupled to the non-inverting control inputs of transmission gates T904 and T908, as well as the inverting control inputs of transmission gates T902 and T906. The output of inverter I904 is coupled to the gate of PMOS FET M906 and to switching block 302. Specifically, the output of inverter I904 is coupled to the non-inverting, control inputs of transmission gates T902 and T906, as well as the inverting control inputs of transmission gates T904 and T908. PMOS FET M906 of control block 320 is contained within current source 974.

Switching block 302 comprises analog transmission gates T902–T908. The input of transmission gate T904 is coupled to ground. Input signal 100 is provided to the input of transmission gate T902. The output of transmission gate T902 is coupled to the output of transmission gate T904 and to the input of transmission gate T906. Reference voltage $V_{REF}$ is provided to the input of transmission gate T908. The outputs of transmission gates T906 and T908 are coupled to the gate of FET M902 of difference amplifier 980.

Difference amplifier 980 includes FETs M902 and M904 that are the inputs to difference amplifier 980. The drains of FETs M902 and M904 are coupled to supply voltage $V_{CC}$. The source of FET M902 is coupled to the base of transistor Q908 and to the collector of transistor Q912. Similarly, the source of FET M904 is coupled to the base of transistor Q910 and to the collector of transistor Q914. Transistors Q908 and Q910 are a differential pair having a common emitter. Resistors 920 and 922 are coupled between ground and the emitters of transistors Q912 and Q914, respectively. The bases of transistors Q912 and Q914 are coupled to the bases of transistors Q916–Q922.

The collectors of transistors Q908 and Q910 are coupled to the emitters of transistors Q904 and Q906, respectively. The bases of cascode-connected transistors Q904 and Q906 are coupled to the emitter of transistor Q932 of biasing circuit 982. The collectors of transistors Q904 and Q906 are coupled to first terminals of resistors R902 and R904, respectively. The collectors of transistors Q904 and Q906 provide the voltage outputs of difference amplifier 980, and are coupled to the bases of transistors Q938 and Q940 of level shift stage 984, respectively. The second terminals of resistors R902 and R904 are coupled together, and are coupled to supply voltage $V_{CC}$ through diode-connected PNP transistor Q902.

Diode-connected transistor Q902 corresponds to diode D302 of FIG. 8. The base of transistor Q902 is coupled to the collector of transistor Q902 and to the base of PNP transistor Q934. The collector of transistor Q902 is coupled to the second terminals of resistors R902 and R904 of difference amplifier 980. The emitter of transistor Q902 is coupled to supply voltage $V_{CC}$. The current $I_{AMP}$ through difference amplifier 980 is mirrored by PNP transistor Q934 at the collector of diode-connected transistor Q902. PNP transistor Q934 sources a current $I_{IN}$ from its collector to Norton amplifier 306 (described below). The emitter of transistor Q934 is coupled to supply voltage $V_{CC}$. PNP transistor Q934 corresponds to transistor Q302 of FIG. 8.

In FIG. 9, biasing circuit 982 is indicated within a dashed line. The collector of transistor Q932 is coupled to supply voltage $V_{CC}$. The base of transistor Q932 is coupled to the base of transistor Q936. Transistor Q936 is diode-connected. The base of transistor Q936 is coupled to the collector of transistor Q936. Resistor R914 is coupled between supply voltage $V_{CC}$ and the collector of transistor Q936. The emitter of transistor Q936 is coupled to a first terminal of resistor R910. The second terminal of resistor R910 is coupled to the base of NPN transistor Q924 and the collector of NPN transistor Q918. The collector of transistor Q924 is coupled to supply voltage $V_{CC}$. The emitter of transistor Q924 is coupled to the bases of transistors Q912 through Q922. Transistors Q916 and Q918 form a current mirror. Resistors R924 and R926 are coupled between ground and the emitters of transistors Q916 and Q918, respectively. The collector of transistor Q916 is coupled to the collector of transistor Q928.

PNP transistor Q928 is diode-connected. The base of transistor Q928 is coupled to its collector. The base of PNP transistor Q928 is coupled to the bases of PNP transistors Q926 and Q930. PNP transistor Q926 sources a bias current $I_{BIAS}$ from its collector to current mirror 970 (described below). Resistor R906 is coupled between the emitter of NPN transistor Q932 and the emitter of PNP transistor Q926. Similarly, resistors R908 and R912 are coupled between the emitter of transistor Q932 and the emitters of PNP transistors Q928 and Q930, respectively. The collector of PNP transistor Q930 sources reference current $I_{REF}$ to Norton amplifier 306 (described below). Biasing circuit 982 provides a bias voltage to cascode-connected transistors Q904 and Q906 of difference amplifier 980. Also, it provides another bias voltage to transistors Q920 and Q922 of level shift stage 984. Further, biasing circuit 982 provides reference and bias currents $I_{REF}$ and $I_{BIAS}$ to Norton amplifier 306 and current mirror 970.

Level shift stage 9134 receives output signals from difference amplifier 980. Specifically, the bases of transistors Q938 and Q940 are coupled to the collectors of cascode-connected transistors Q904 and Q906, respectively. The collectors of NPN transistors Q938 and Q940 are coupled to supply voltage $V_{CC}$. The emitters of transistors Q938 and Q940 are coupled to diode-connected transistors Q942 and Q944, respectively. The bases of transistors Q942 and Q944 are each connected to the collector of transistors Q942 and Q944, respectively. The emitters of transistors 942 and 944 are coupled to the collectors of transistors Q920 and Q922, respectively. Resistors R928 and R930 are coupled between ground and the emitters of transistors Q920 and Q922, respectively. The emitters of diode-connected transistors Q942 and Q944 of level shift stage 984 are coupled to the bases of transistors Q952 and Q950 of second amplification stage 986, respectively. Thus, the emitters of transistors Q942 and Q944 of level shift stage 984 provide output signals to second amplification stage 986.

Second amplification stage 986 comprises a differential pair Q950 and Q952. The emitters of transistors Q950 and Q952 are coupled together to the collector of transistor Q954. A resistor R932 is coupled between the emitter of transistor Q954 and ground. Transistor Q954 is biased by voltage $V_{PKBIAS}$ coupled to the base of transistor Q954. Transistor Q954 and resistor R932 are a conventional prior art current source. The collector current of transistor Q952 of second amplification stage 986 controls the current $I_{SINK}$ of current sink 972. Similarly, the collector current of transistor 950 of second amplification stage 986 controls current $I_{SOURCE}$ of current source 974.

Current sink 972 is coupled to the collector of transistor 952 of second amplification stage 986. Specifically, the collector of PNP transistor Q946 is coupled to the collector of NPN transistor Q952 of second amplification stage 986. Resistor R938 is coupled between supply voltage $V_{CC}$ and the emitter of transistor Q946. A first terminal of resistor R942 is coupled to the base of transistor Q946. The second terminal of transistor R942 is coupled to the collector of transistor Q946 and to the base of transistor Q948. Resistor R940 is coupled between supply voltage $V_{CC}$ and the emitter of transistor Q948. Thus, a current is sourced from the collector of transistor Q948 that is proportional to the current sunk by transistor Q952 of second amplification stage 986.

The collector of transistor Q948 is coupled to the collector of transistor Q956 and to the base of transistor Q958. The collector of transistor Q958 is coupled to supply voltage $V_{CC}$. Resistor R934 is coupled between the emitter of transistor Q956 and ground. The emitter of transistor Q958 is coupled to the bases of transistors Q956 and Q960. Resistor R936 is coupled between ground and the emitter of transistor Q960. Transistors Q956 and Q960 form a current mirror. Thus, transistor Q960 sinks current $I_{SINK}$ that is proportional to the current sourced from the collector of transistor Q946. The collector of transistor Q960 of current sink 972 is coupled to the FET input M904 (gate) of difference amplifier 980, current source 974, and capacitor C102.

Current sink 972 further includes FETs M908 and M910 of control block 320. The drain of FET M908 is coupled to the base of transistor Q958. The gates of FETs M908 and M910 are coupled together to the output of inverter I902. The drain of FET M910 is coupled to the emitter of transistor Q958 and to the bases of transistors Q956 and Q960. The sources of FETs M908 and M910 are coupled to ground.

The collector of PNP transistor Q962 of current source 974 is coupled to the collector of NPN transistor Q950 of second amplification stage 986. Resistor R940 is coupled between supply voltage $V_{CC}$ and the emitter of PNP transistor Q962. A first terminal of resistor R948 is coupled to the base of transistor Q962, The second terminal of resistor R948 is coupled to the collector of transistor Q962 and the base of PNP transistor Q964, Resistor R946 is coupled between supply voltage $V_{CC}$ and the emitter of transistor Q964. Transistors Q962 and Q964 of current source 974 form a current mirror.

Current source 974 includes FET M906 of control block 320. The output of inverter I904 of control block 320 is coupled to the gate of FET M906. The drain of FET M906 is coupled to the base of transistor Q964, The source of FET M906 is coupled to supply voltage $V_{CC}$, Capacitor C102 is coupled between the collector of transistor 964 and ground. Transistor Q964 of current source 974 sources an output current $I_{SOURCE}$ that is proportional to the current sunk by transistor Q950 of second amplification stage 986.

The collector of PNP transistor Q930 of biasing circuit 982 sources a current $I_{REF}$ to Norton amplifier 306. Specifically, the collector of transistor Q930 is coupled to the collector of NPN transistor Q976. Transistor Q976 is diode-connected. The base of transistor Q976 is coupled to the collector of transistor Q976 and to the base of transistor Q974. The emitters of transistors Q974 and Q976 are coupled to ground. A first terminal of capacitor C902 is coupled to the bases of transistors Q974 and Q976. A second terminal of capacitor C902 is coupled to the collector of transistor Q974 and to the base of transistor Q972. Resistor R918 is coupled between the emitter of transistor Q972 and ground. The collector of transistor Q934 sources a current $I_{IN}$ to the collector of transistor Q974, the base of transistor Q972 and the second terminal of capacitor C902. Current $I_{IN}$ is proportional to the current through difference amplifier 980. Norton amplifier receives input current $I_{IN}$ from transistor Q934 and reference current $I_{REF}$ from transistor Q930 of biasing circuit 982.

The collector of transistor Q972 provides the output of Norton amplifier 306 which is coupled to the collector of transistor Q970 of current mirror 976. Transistor Q926 of biasing circuit 982 sources bias current $I_{BIAS}$ to current mirror 976 and the output of Norton amplifier 306. The collector of transistor Q926 of biasing circuit 982 is coupled to the collector of transistor 972, the base of transistor Q966, and the collector of transistor Q970. The collector of transistor Q966 of current mirror 976 is coupled to supply voltage $V_{CC}$. The emitter of transistor Q966 is coupled to the bases of transistors Q968 and Q970, as well as a first terminal of resistor R916. The emitters of transistors Q968 and Q970, as well as the second terminal of resistor R916, are coupled to ground. The collector of transistor Q968 of current mirror 976 is coupled to the emitters of transistors Q908 and Q910 of difference amplifier 980. Transistor 968 sinks constant current $I_{AMP}$. Current mirror 976 replaces transistor Q202 of FIG. 8.

As illustrated in FIG. 9, the PKDET and RESET signals are provided to the control block 320 of the present invention. The closed-loop peak detector operates in three modes: reset, peak detect and hold. The peak detector comprises a difference amplifier 980 having a non-inverting input (FET M902) coupled through switching block 302 to input signal 100 (which can be a full wave rectified signal) or a reference voltage $V_{REF}$. The output voltage $V_{OUT}$ across capacitor C102 is coupled in a feedback loop to the inverting input (FET M904) of difference amplifier 980. Transistors Q904 and Q906 of difference amplifier 980 are biased by the voltage at the emitter of transistor Q932 of biasing circuit 982. The cascode configuration of transistors Q904 and Q906 with differential pair Q908 and Q910 provides high output impedance at the collectors of transistors Q904 and Q906. Also, it prevents undesired high frequency feedback in transistors Q908 and Q910.

Current mirror 976 sinks a constant current $I_{AMP}$ through transistors Q908 and Q910. Imbalances between the voltages applied to the gates of FETs M902 and M904 steer currents through transistors Q908 and Q910. This produces a voltage difference between the collector voltages of cascode transistors Q904 and Q906 that is output to the level shift stage 984. When the gate voltages of FETs M902 and M904 are equal, current $I_{AMP}$ divides evenly ($I_{AMP}/2$) through transistors Q908 and Q910. This produces equal voltages applied to the bases of transistors Q938 and Q940 of level shift stage 984.

Biasing circuit 982 provides bias voltages to difference amplifier 980 and level shift stage 984. It also provides currents $I_{REF}$ and $I_{BIAS}$ to Norton amplifier 306 and current mirror 976. Diode-connected transistors Q936 and Q918 and resistors R910, R914 and R926 establish a stable operating current in biasing circuit 982. The base voltage of transistor Q918 biases proportional currents through transistors Q912 and Q914 of difference amplifier 980, Q920 and Q922 of level shift stage 984, and Q916 of biasing circuit 982. Transistor Q932 produces an emitter voltage for biasing cascode-connected transistors Q904 and Q906 of difference amplifier 980. The emitter voltage of transistor Q932 also establishes a known voltage for other current sources in biasing circuit 982.

Biasing circuit 982 comprises another current mirror circuit containing transistor Q928. Transistor Q916 produces a known current through transistor Q928 and resistor R908, thereby producing known currents $I_{REF}$ and $I_{BIAS}$ through transistors Q930 and Q926. The currents $I_{REF}$ and $I_{BIAS}$ are generated in response to the base voltage of transistor Q928 applied to the bases of transistors Q926 and Q930. The collector of transistor Q930 sources current $I_{REF}$ to Norton amplifier 306. Similarly, the collector of transistor Q926 sources current $I_{BIAS}$ to current mirror 976.

Transistor Q934, Norton amplifier 306 and constant current $I_{BIAS}$ form a feedback loop used to maintain a constant current $I_{AMP}$ sunk by current mirror 976 having near-ground voltage compliance. Diode-connected transistor Q902 samples operating current $I_{AMP}$ in the difference amplifier 980. In turn, transistor Q934 sources a current $I_{IN}$ to Norton amplifier 306 that is proportional to $I_{AMP}$. Norton amplifier 306 receives reference current $I_{REF}$ from biasing circuit 982. Norton amplifier 306 mirrors current $I_{REF}$ (through transistor Q976) in transistor Q974. Capacitor C902 provides frequency stability since Norton amplifier 306 is contained in the feedback loop of the current sink having near-ground compliance in the present invention. The difference in current between current $I_{IN}$ (sourced by transistor Q934) and the fixed current $I_{REF}$ through transistor Q974 biases transistor Q972. Transistor Q972 is emitter degenerately configured (R918).

The difference between currents $I_{IN}$ and $I_{REF}$ modulates the current $I_{AMP}$ sunk by current mirror 976. Changes in the bias current to transistor Q972 varies the collector current of transistor Q972 and draws current $\Delta I$ from the fixed current $I_{BIAS}$ sourced by PNP transistor Q934 (typically, current $I_{BIAS}$ is 20% larger than current $I_{REF}$ when Norton amplifier is not connected to current mirror 976). Transistor Q966 biases the bases of transistors Q968 and Q970. The current ($I_{BIAS}-\Delta I$) through transistor Q970 determines current $I_{AMP}$ sunk by transistor 968. Thus, the output of Norton amplifier 306 modulates the current $I_{AMP}$ sunk by current mirror 976 in response to differences in current between currents $I_{IN}$ and $I_{REF1}$. Current $I_{IN}$ is sourced in response to current $I_{AMP}$ through difference amplifier 980 sampled by transistor Q902.

The base voltage of transistor Q918 biases transistors Q920 and Q922 of level shift stage 984 to produce fixed, equal currents through transistors Q920 and Q922. The collector voltages of transistors Q904 and Q906 are applied to the bases of transistors Q938 and Q940. Level shift stage 984 translates down the collector voltages of transistors Q904 and Q906 by two base-emitter drops ($2V_{BE}$) at the emitters of diode-connected transistors Q942 and Q944. The emitter voltages of transistors 942 and 944 of level shift stage 984 bias the bases of differential pair transistors Q952 and Q950 of second amplification stage 986, respectively. Transistor Q954 is biased by bias voltage $V_{PKBIAS}$ to produce a constant collector current sunk by transistor Q954. Bias voltage $V_{PKBIAS}$ may be a voltage received from a digital-to-analog converter (DAC) to set the collector current of transistor Q954.

The constant collector current of transistor Q954 is sunk from the emitters of transistors Q952 and Q950 according to the difference in emitter voltages of transistors Q942 and Q944, respectively. A current proportional to the collector current of Q952 is sourced by the collector of Q948 of the current mirror comprising PNP transistors Q946 and Q948. The collector current of transistor Q952 is provided to a current mirror comprising transistors Q956 and Q960. The emitter of transistor Q958 biases transistors Q956 and Q960. The collector of transistor Q960 of current sink 972 is coupled to capacitor C102. The collector current of transistor Q948 is mirrored by transistors Q956 and Q960 to produce current $I_{SINK}$.

The drain of FET M908 is coupled to the base of transistor Q958. Similarly, the drain of FET M910 is coupled to the bases of transistors Q956 and Q960. When RESET signal is low, the output of inverter I902 of control block 320 is high. The high output of inverter I902 enables FETs M908 and M910, thereby pulling the bases of transistors Q956, Q958 and Q960 to ground. This disables the output current mirror comprising transistors Q956 and Q960. The output (collector of transistor Q960) of current sink 972 is put into a low leakage current state. When RESET signal is high, current sink 972 operates as described above. Transistor Q960 sinks $I_{SINK}$ in response to base voltage differences between transistors Q952 and Q950 of second amplification stage 986.

A current proportional to the collector current of Q950 is sourced by the collector of transistor Q964 of the current mirror comprising PNP transistors Q962 and Q964. The collector of transistor Q964 of current source 974 is coupled to capacitor C102. The collector of transistor Q964 sources current $I_{SOURCE}$ to capacitor C102. Transistor Q964 sources $I_{SOURCE}$ in response to base voltage differences between transistors Q952 and Q950 of second amplification stage 986.

The drain of PMOS FET M906 is coupled to the base of transistor Q964. When RESET signal is high and/or the PKDET signal is low, the output of inverter I904 of control block 320 is low. The low output of inverter I904 enables FET M906, thereby pulling the base of transistor Q964 up to supply voltage $V_{CC}$. This disables transistor Q964. The output (collector of transistor Q964) of current source 974 is put into a low leakage current state. When RESET signal is low and the PKDET signal is high, current sink 974 operates as described above.

As illustrated in FIG. 9, the PKDET and RESET signals are provided to the peak detector circuit of the present invention. The circuit operates in three modes: reset, peak detect and hold. The PKDET and RESET signals control operation of switching block 302 and current sink 972 and source 974. Table 1 lists the input voltage $V_{IN}$ (gate of FET M902) of differential amplifier 980 and the states of current sink 972 and source 974 in response to the PKDET and RESET signals.

TABLE 1

| Mode | PKDET | RESET | VIN | Sink 972 | Source 974 |
|------|-------|-------|-----|----------|------------|
| hold | 0 | 0 | $V_{REF}$ | Disabled | Disabled |
| peak detect | 1 | 0 | Input Signal 100 | Disabled | Enabled |
| reset | 0 | 1 | $V_{REF}$ | Enabled | Disabled |
| don't care | 1 | 1 | $V_{REF}$ | Enabled | Disabled |

As indicated in Table 1, the RESET signal overrides the PKDET signal. Thus, when both signals are logic high, the closed-loop peak detector of FIG. 9 is kept in the reset mode.

Referring to FIG. 9, when in the reset mode, switching block 302 couples the gate of FET M902 of difference amplifier 980 to reference voltage $V_{REF}$. Current source 974 is disabled and current sink 972 is enabled. When output voltage $V_{OUT}$ is greater than voltage reference $V_{REF}$, a positive voltage difference is produced between the collectors of transistors Q904 and Q906. This difference in collector voltages sinks a larger current through transistor Q952 than through transistor Q950. However, in reset mode, current source 974 is disabled in a low leakage current state. Accordingly, a proportional current $I_{SINK}$ is sunk by current sink 972 to discharge capacitor C102. The low output of inverter I902 enables current sink 972. Current sink 972 continues to draw charge from capacitor C102 until the output voltage $V_{OUT}$ of the peak detector is discharged to a value slightly less than the baseline voltage $V_{REF}$ applied to the gate of FET M902. When this occurs, the difference in collector voltages of transistors Q904 and Q906 output by difference amplifier 304 becomes negative. This maintains the output voltage $V_{OUT}$ at the constant baseline level of $V_{REF}$.

When in the peak detection mode, the PKDET signal is high and the RESET signal is low. Input signal 100 is provided to FET M902 by switching block 302. The output of inverter I902 of control block 320 is high, thereby disabling current sink 972. When input signal 100 is lower than the voltage $V_{OUT}$ stored across capacitor C102, the positive voltage difference across the collectors of transistors Q904 and Q906 reduces the current through transistor Q950 of second amplification stage 986 to zero. In turn, the current mirrored by transistor Q964 becomes zero, thereby preventing charging of capacitor C102. When input signal 100 exceeds output voltage $V_{OUT}$, the negative voltage difference across the collectors of transistors Q904 and Q906 switches on the current through transistor Q950 of second amplification stage 986. Current source 974 charges capacitor C102 until the input signal 100 decreases below the instantaneous level of output voltage $V_{OUT}$. Difference amplifier 980 has a MOSFET input comparator that does not require bias current. It compares the input signal 100 with the voltage $V_{OUT}$ using closed loop feedback.

When the voltage difference across the collectors of transistors Q904 and Q906 is negative, current source 974 provides current $I_{SOURCE}$ to charge capacitor C102 until the output voltage $V_{OUT}$ is equal to the instantaneous value of the input signal 100. The output voltage $V_{OUT}$ across capacitor C102 is slew-rate limited. Therefore, the present invention requires a series of positive lobes of input signal 100 to pump up voltage $V_{OUT}$ to the most positive value of input signal 100. Thus, in peak detect mode, current source 974 successively charges capacitor C102 when input signal 100 exceeds voltage $V_{OUT}$, thereby increasing voltage $V_{OUT}$.

In the hold mode of the present invention, the PKDET and RESET signals are both low. In this mode, switching block 302 couples reference voltage $V_{REF}$ to FET M902 of difference amplifier 980. With the PKDET and RESET signals low, current sink 972 and source 974 are disabled. Thus, current is not sourced to or drained from capacitor C102, and capacitor C102 maintains a nearly constant amount of charge. Thus, the output voltage $V_{OUT}$ is equal to the peak voltage of the input signal 100 stored in capacitor C102.

TIMING DIAGRAM ILLUSTRATING THREE MODES

FIG. 4 is a timing diagram illustrating the input voltage applied to FET M902 of difference amplifier 980 and the corresponding output voltage signal $V_{OUT}$. The input voltage at FET M902 is indicated by a dotted line. During times 0 to $T_1$, the PKDET signal is low and the RESET signal is high. Initially, capacitor C102 is discharged and, thus, the output signal $V_{OUT}$ has a level of 0 volts (indicated by a solid line). Because switching block 302 provides voltage $V_{REF}$ to the FET M902, the input voltage $V_{IN}$ is equal to $V_{REF}$. As indicated in FIG. 4, current source 974 is disabled. Current sink 972 does not sink current because current $I_{AMP}$ is steered through transistor 950 of second amplification stage 986. The output voltage $V_{OUT}$ is maintained near ground.

Between times $T_1$ and $T_3$, the present invention operates in the peak detect mode. As illustrated in FIG. 3B, the PKDET signal is high and the RESET signal is low. In this mode, FET M902 is coupled to input signal 100. In FIG. 4, the input signal 100 (indicated by a dashed line) is a full-wave rectified voltage signal. The diagram illustrates six lobes of input signal 100 during this interval.

At time $T_1$, the output voltage $V_{OUT}$ is equal to 0 volts. Between times $T_1$ and $T_2$, the input signal 100 provided to FET M902 is greater than the output signal $V_{OUT}$ provided to FET M904 This produces a larger voltage at the collector of transistor Q906 than Q904 of difference amplifier 980. Current source 974 charges capacitor C102 in response to the current sunk by transistor Q950. In FIG. 4, the output voltage $V_{OUT}$ increases between times $T_1$ and $T_2$ in response to the input signal 100.

At time $T_2$, the instantaneous voltage $V_{OUT}$ rises to the lowest level of input signal 100. Difference amplifier 980 produces a positive voltage difference at the collectors of transistors Q904 and Q906. This turns off current source 974 (current sink 972 is disabled by the output of inverter I902). Because current sink 972 and source 974 are disabled, the output voltage $V_{OUT}$ of the peak detector is held at a constant level. The output voltage $V_{OUT}$ remains constant until the voltage of input signal 100 applied to difference amplifier exceeds the output voltage $V_{OUT}$. Between times $T_2$ and $T_3$, the output voltage $V_{OUT}$ periodically increases as capacitor C102 is charged by current source 974.

At time $T_3$, the peak detector is switched to the hold mode by setting low the PKDET and RESET signals. Both current sink 972 and source 974 ($I_{SINK}$ and $I_{SOURCE}$) are disabled. During the hold mode, switching block 302 is coupled to constant voltage reference $V_{REF}$ as indicated by the constant level (indicated by a dotted line). In FIG. 4, between times $T_3$ and $T_4$, the output voltage $V_{OUT}$ is held at a constant level $V_1$ (where voltage $0 \leq V_1 \leq V_{MAX}$).

At time $T_4$, the peak detector of the present invention operates in the reset mode. The PKDET signal is low and the RESET signal is high. Setting the PKDET signal to zero disables current source 974. Switching block 302 couples FET M902 of differential amplifier 980 to the reference voltage $V_{REF}$. As indicated in FIG. 4, the output voltage $V_{OUT}$ (solid line) has a value of $V_1$. It is greater than the input voltage $V_{IN}$ of differential amplifier 980 (indicated by a dotted line) equal to $V_{REF}$. Differential amplifier 980 produces a negative collector voltage difference across transistors Q904 and Q906, thereby producing current $I_{SINK}$ that discharges capacitor C102. The output voltage $V_{OUT}$ decreases from a level of $V_1$ to $V_{REF}$.

At time $T_5$, $V_{OUT}$ reaches the reference voltage $V_{REF}$ coupled to differential amplifier 980. In turn, the output of differential amplifier 980 disables current source 974. Between times $T_5$ and $T_6$, the output voltage $V_{OUT}$ has a constant level of $V_{REF}$.

At time $T_6$, the present invention operates in the peak detect mode. Between times $T_6$ and $T_7$, input signal 100 is coupled to FET M902 of differential amplifier 980. In FIG. 4, there are six lobes of the input signal 100 during this interval. When input signal 100 exceeds the output signal $V_{OUT}$, differential amplifier 980 produces a negative collector voltage difference across transistors Q904 and Q906. In response, current source 974 charges capacitor C102 until the input signal 100 decreases below the instantaneous value of the output voltage $V_{OUT}$. Prior to time $T_7$, current source 974 charges hold capacitor C102 to the peak value of the input signal 100 (as illustrated in FIG. 4).

At time $T_7$, the present invention is operated in the hold mode where the PKDET and RESET signals are low. This disables current source 974 and sink 972 which prevents the sourcing and sinking of current to holding capacitor C102. Thus, in FIG. 4, the output voltage $V_{OUT}$ remains at its peak value of $V_{MAX}$ after time $T_7$.

The present invention provides closed loop peak detection with low offset voltage, no amplifier slew-rate limitations, and with enhanced noise rejection capability. The peak voltage stored on holding capacitor C102 is not affected by the timing of the peak detect signal applied to control block 320. The peak detector also turns itself off. Thus, external logic timing is not critical. A further advantage of the present invention is that the current source drive provides superior noise rejection. Another advantage is that the accuracy of the peak detector is determined by the comparator offset voltage. No matching time constants are required between channels. Yet another advantage of the present invention is that the MOSFET input comparator has a minimal input bias current. Thus, little current is drained off from holding capacitor C102 by the FET M904 input of difference amplifier 980. Still another advantage of the present invention is that there are no operational amplifier slew-rate/clamp problems. And yet another advantage is that the reset voltage is always equal to or less than $V_{REF}$ voltage.

In this manner, a closed-loop peak detector is disclosed.

I claim:

1. A circuit for providing peak detection comprising:
   switching means for receiving a plurality of input signals;
   comparing means coupled to said switching means, said switching means selectively providing one of said plurality of input signals to said comparing means;
   control means coupled to said comparing means, said control means for receiving first and second control signals;
   first and second current sources coupled to said control means;
   a capacitor means coupled to said first and second current sources for generating, in conjunction with said first and second current sources, an output signal, said output signal being feedback coupled to said comparing means, said comparing means for determining when one of said plurality of input signals exceeds said output signal, said control means for enabling and disabling said first and second current sources in response to said comparing means and to said first and second control signals.

2. The circuit of claim 1 wherein said plurality of input signals comprises a fixed voltage signal for providing a reference voltage.

3. The circuit of claim 1 wherein said plurality of input signals comprises a full-wave or half-wave rectified signal.

4. The circuit of claim 1 wherein said first current source sources a first current for charging said capacitor.

5. The circuit of claim 1 wherein said second current source sinks a second current for discharging said capacitor.

6. A circuit for providing peak detection comprising:
   switching means for receiving a plurality of input signals;
   comparing means coupled to said switching means, said switching means selectively providing one of said plurality of input signals to said comparing means;
   control means coupled to said switching means, said control means for receiving first and second control signals;
   first and second current sources coupled to said control means;
   a capacitor means coupled to said first and second current sources for generating, in conjunction with said first and second current sources, an output signal, said output signal signal feedback coupled to said comparing means, said comparing means for determining when one of said plurality of input signals exceeds said output signal, said control means for enabling and disabling said first and second current sources in response to said comparing means and to said first and second control signals.

7. The circuit of claim 6 wherein said plurality of input signals comprises a fixed voltage signal for providing a reference voltage.

8. The circuit of claim 6 wherein said plurality of input signals comprises a full-wave or half-wave rectified signal.

9. The circuit oil claim 6 wherein said first current source sources a first current for charging said capacitor.

10. The circuit of claim 6 wherein said second current source sinks a second current for discharging said capacitor.

11. The circuit of claim 6 wherein said comparing means comprises a differential amplification means.

12. The circuit of claim 11 wherein said differential amplification means comprises first and second FETs for receiving said one of said plurality of input signals.

13. The circuit of claim 6 wherein said switching means comprises a plurality of transmission gates.

* * * * *